United States Patent
Cao et al.

(10) Patent No.: US 10,564,554 B2
(45) Date of Patent: Feb. 18, 2020

(54) SYSTEM AND METHOD FOR ANALYZING PRINTED MASKS FOR LITHOGRAPHY BASED ON REPRESENTATIVE CONTOURS

(71) Applicant: GLOBALFOUNDRIES INC., Grand Cayman (KY)

(72) Inventors: Liang Cao, Clifton Park, NY (US); Jed H. Rankin, Richmond, VT (US); Jie Zhang, Clifton Park, NY (US); Yulu Chen, West Sand Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 233 days.

(21) Appl. No.: 15/874,039

(22) Filed: Jan. 18, 2018

(65) Prior Publication Data

US 2019/0219933 A1  Jul. 18, 2019

(51) Int. Cl.
| | | |
|---|---|---|
| *G03F 7/20* | (2006.01) |
| *G06F 17/50* | (2006.01) |
| *G03F 1/42* | (2012.01) |
| *G03F 7/26* | (2006.01) |
| *G03F 9/00* | (2006.01) |
| *G03F 1/36* | (2012.01) |
| *G03F 1/84* | (2012.01) |
| *G03F 1/70* | (2012.01) |
| *H01L 21/027* | (2006.01) |
| *H01L 21/66* | (2006.01) |

(52) U.S. Cl.
CPC ............ *G03F 7/70775* (2013.01); *G03F 1/36* (2013.01); *G03F 1/42* (2013.01); *G03F 1/70* (2013.01); *G03F 1/84* (2013.01); *G03F 7/20* (2013.01); *G03F 7/26* (2013.01); *G03F 9/7046* (2013.01); *G06F 17/5081* (2013.01); *H01L 21/0273* (2013.01); *H01L 22/12* (2013.01)

(58) Field of Classification Search
CPC ..... G03F 1/36; G03F 1/42; G03F 1/70; G03F 1/84; G03F 7/20; G03F 7/26; G03F 7/70775; G03F 9/7046; G06F 17/5081
USPC ....................................... 430/5, 30
See application file for complete search history.

(56) References Cited

U.S. PATENT DOCUMENTS 9,046,754 B2    6/2015  Sewell et al.
9,747,518 B2    8/2017  Zhao et al.

*Primary Examiner* — Christopher G Young
(74) *Attorney, Agent, or Firm* — Anthony Canale; Hoffman Warnick LLC

(57) ABSTRACT

Embodiments of a method include: converting at least one image of a printed mask to a plurality of representative contours, each corresponding to mask patterns in the printed mask; determining whether the printed mask includes a printing defect based on whether the plurality of representative contours violates a set of contour tolerances for the printed mask; in response to at least one of plurality of representative contours violating at least one of the set of contour tolerances: identifying a location where a representative contour violates the at least one of the set of contour tolerances, and generating an instruction to adjust a layout for the printed mask, based on the violating of the at least one of the set of contour tolerances; and in response to none of the plurality of representative contours violating the set of contour tolerances, flagging a layout for the printed mask as compliant.

20 Claims, 7 Drawing Sheets

SYSTEM AND METHOD FOR ANALYZING PRINTED MASKS FOR LITHOGRAPHY BASED ON REPRESENTATIVE CONTOURS

BACKGROUND

Technical Field

The present disclosure relates to integrated circuit (IC) fabrication. More specifically, the present disclosure relates to processes for creating a plurality of representative contours from a printed mask, and then using the representative contours as a substitute for directly analyzing an image of the printed mask. The details for analysis may include comparing the representative contours against predetermined rules for whether the contours indicate printing defects in the mask.

Related Art

Fabrication foundries ("fabs") may manufacture ICs using photolithographic processes. Photolithography is an optical printing and fabrication process by which patterns on a photolithographic mask (simply "mask" hereafter) are imaged and defined onto a photosensitive layer coating of a substrate. To manufacture an IC, masks are created using a specification, including an IC layout, as a template. The masks contain the various geometries of the IC layout, and these geometries may be separated with layers of photoresist material. The various geometries contained on the masks correspond to the various base physical IC elements that make up functional circuit components such as transistors, interconnect wiring, via pads, as well as other elements that are not functional circuit elements but are used to facilitate, enhance, or track various manufacturing processes. Through sequential use of the various masks corresponding to a given IC in an IC fabrication process, a large number of material layers of various shapes and thicknesses with different conductive and insulating properties may be built up to form the overall IC and the circuits within the IC layout.

As integrated circuit (IC) components have continued to decrease in size, improvements to scale have spawned design implementation issues for some types of geometries, e.g., in complementary metal-oxide-semiconductor (CMOS) ICs with geometries sized less than approximately twenty-two nanometers (nm). As IC technology continues to shrink, the growing need for empirical data from a design may exacerbate the uncertainty of the manufacturing process, thereby increasing the risk of defects or impaired operability. Automated techniques for modeling and identifying defects, misprints, etc., in a mask may be inherently limited by the need to have a user visually search for defects, problem areas, etc., in a printed mask.

Post-printing analysis of a mask is conventionally needed to identify problem areas not previously identified in a model for the mask. In particular, the etch-related forming of some possible defects, e.g., bridging, pinching, and edge placement errors (EPEs) may prevent such errors in a mask from being detected directly from the design layouts and/or models of a mask. Current processing methodology involves converting an image of a printed mask into a pixelated grayscale format, and then examining the converted image to identify product defects, such as misprints, by identifying such defects within the image of the printed mask. The need to create and use pixelated grayscale images of a mask may provide a limited ability to detect defects, e.g., due to the optical resolution limit of some image capture technologies (e.g., aerial image representations of a mask, which may be no more precise than, e.g., increments of forty nanometers). Other image formats may be burdened by other limitations, e.g., the amount of computational intensity and inefficiency of processing such formats (e.g., higher-resolution scanning electron microscope (SEM) images).

SUMMARY

A first aspect of the disclosure provides a method including: converting at least one image of a printed mask to a plurality of representative contours, the plurality of representative contours corresponding to mask patterns in the printed mask; determining whether the printed mask includes a printing defect based on whether the plurality of representative contours violates a set of contour tolerances, the set of contour tolerances defining printing limits for the printed mask; in response to at least one of plurality of representative contours violating at least one of the set of contour tolerances: identifying a location in the at least one of the plurality of representative contours which violates the at least one of the set of contour tolerances, and generating an instruction to adjust a layout for the printed mask, based on the violating of the at least one of the set of contour tolerances; and in response to none of the plurality of representative contours violating the set of contour tolerances, flagging a layout for the printed mask as complying with the set of contour tolerances.

A second aspect of the disclosure provides a computer program product stored on a computer readable storage medium, the computer program product including program code, which, when being executed by at least one computing device, causes the at least one computing device to: convert at least one image of a printed mask to a plurality of representative contours, the plurality of representative contours corresponding to mask patterns in the printed mask; determine whether the printed mask includes a printing defect based on whether the plurality of representative contours violates a set of contour tolerances, the set of contour tolerances defining printing limits for the printed mask; in response to at least one of plurality of representative contours violating at least one of the set of contour tolerances, causing the at least one computing device to: identify a location in the at least one of the plurality of representative contours which violates the at least one of the set of contour tolerances, and generate an instruction to adjust a layout for the printed mask, based on the violating of the at least one of the set of contour tolerances; and in response to none of the plurality of representative contours violating the set of contour tolerances, causing the at least one computing device to flag a layout for the printed mask as complying with the set of contour tolerances.

A third aspect of the present disclosure provides a system including at least one computing device configured to perform a method by performing actions including: converting at least one image of a printed mask to a plurality of representative contours, the plurality of representative contours corresponding to mask patterns in the printed mask; determining whether the printed mask includes a printing defect based on whether the plurality of representative contours violates a set of contour tolerances, the set of contour tolerances defining printing limits for the printed mask; in response to at least one of plurality of representative contours violating at least one of the set of contour tolerances: identifying a location in the at least one of the plurality of representative contours which violates the at least one of the set of contour tolerances, and generating an instruction to adjust a layout for the printed mask, based on the violating of the at least one of the set of contour tolerances; and in response to none of the plurality of representative contours violating the set of contour tolerances, flagging a layout for the printed mask as complying with the set of contour tolerances.

Figure 1:
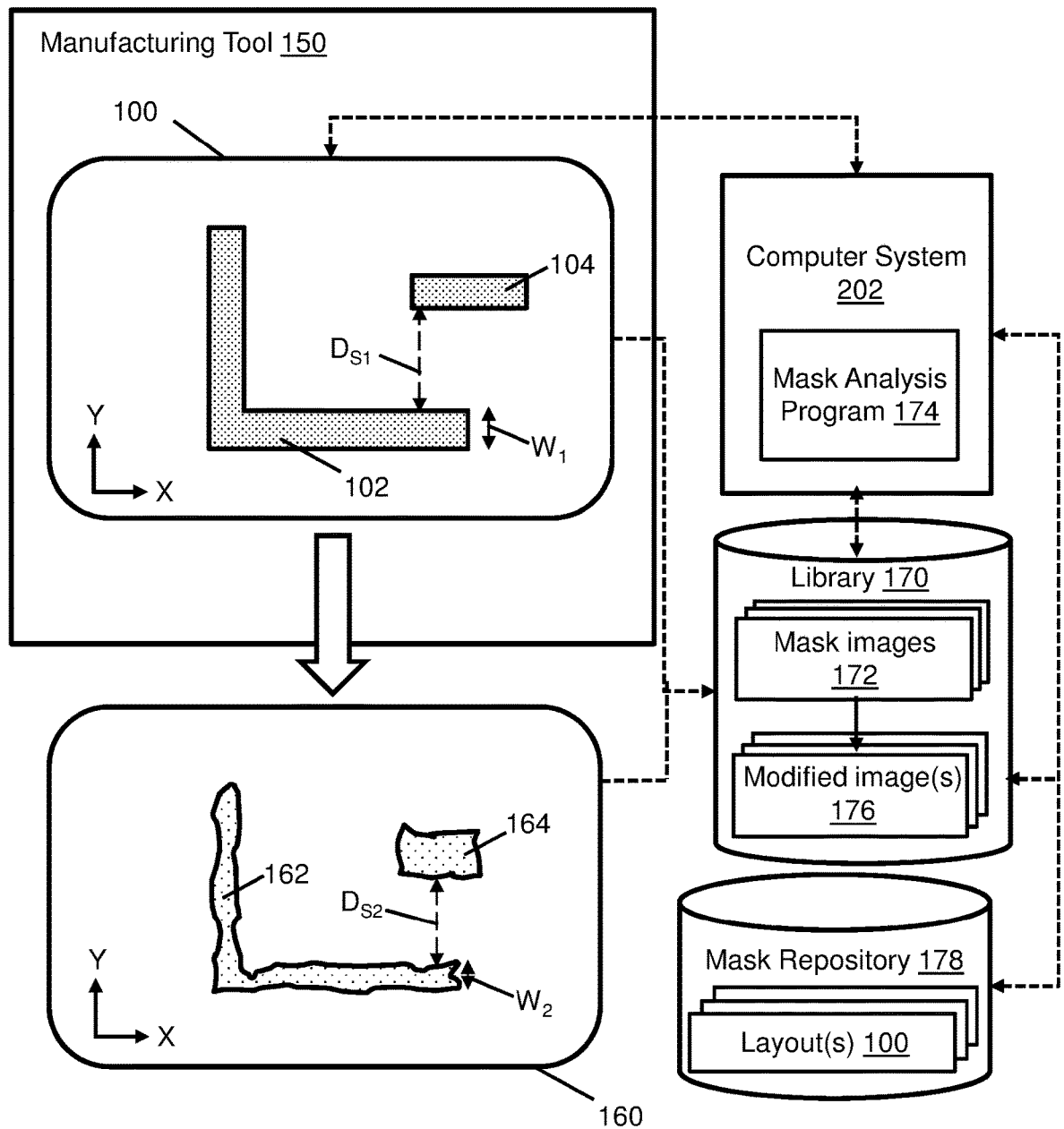
FIG. 1 provides a schematic data flow diagram of components and processes for analyzing a printed mask using representative contours according to embodiments of the disclosure.

It is noted that the drawings of the disclosure are not necessarily to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure rely upon image processing techniques to automate various aspects of integrated circuit (IC) (alternatively, "circuit") manufacture. More specifically, embodiments of the disclosure pertain to improving the quality of masks used in photolithographic processing in IC manufacture. Methods according to the disclosure may involve converting images of a printed mask into representative contours. The contours are suitable for analyzing a printed mask for printing defects without performing a separate analysis on the original mask image. The method further includes generating an instruction to adjust a manufacturing tool for producing the printed mask in cases where the representative contours violate a tolerance for acceptable printing, or flagging a layout for the mask as being compliant with manufacturing requirements.

To better illustrate the various embodiments of the present disclosure, particular terminology which may be known or unknown to those of ordinary skill in the art is defined to further clarify the embodiments set forth herein. The term "system" can refer to a computer system, server, etc. composed wholly or partially of hardware and/or software components, one or more instances of a system embodied in software and accessible a local or remote user, all or part of one or more systems in a cloud computing environment, one or more physical and/or virtual machines accessed via the internet, other types of physical or virtual computing devices, and/or components thereof. The terms "layout" or "mask layout" can refer to a complete or partial mapping of masking material to be used for forming (e.g., by various combinations of etching, deposition, etc.) a particular layer which includes multiple features ("features"). The layout for a particular mask may be obtained from design data and/or generated, modified, etc., with the aid of optical proximity correction (OPC) or other design-enhancement systems. A "feature" generally refers to a functional element in an IC product (e.g., a wire) which must be printed on a wafer using photolithography techniques. A "region" refers to any subset of a given mask. A "pattern" or "feature pattern" refers to a design layout representation of one or more portions of a mask which define the features to be formed in a particular IC product, and which may be formed with the aid of a mask by way of, for example, direct-write electron beam lithography. The patterns in a mask may be structured and positioned to cover underlying materials, and thereby protect them from being etched away while other portions of a layer are being removed.

The terms "contour," "representative contour," and the like, refer to a two-dimensional representation of an object shown in a reference image, e.g., a greyscale image generated by way of microscopy. The general process to convert an image of one or more objects into a group of representative contours may include targeting particular objects (e.g., a mask feature) for conversion, and creating a profile of the targeted object to remove irrelevant image data without sacrificing resolution and/or geometrical fidelity of the targeted object. According to an example, contours may be generated by procedures such as, but not limited to, e.g., detecting sets of coarse edges (e.g., pixel curves within a particular range of thicknesses) within an image, filtering noise and/or other artifacts from the image to remove structures not pertaining to the targeted object(s), mapping the detected edges onto a two dimensional space, and constructing the contour representation from the result of such processes.

The related concept of a "contour tolerance" may refer to a predetermined range of acceptable contours for one or more portions of a particular mask feature, or for an entire mask feature. In some cases, a contour tolerance may take the form of a minimum surface area to be occupied by a particular feature, and a maximum surface area to be occupied by a particular feature. In this case, a representative contour being positioned "between" a set of contour tolerances may refer to the contour having a surface area and profile that is equal to or greater than the minimum desired surface area, while simultaneously being equal to or less than the maximum desired surface area. Conversely, a representative contour "violating" its contour tolerance refers to situations in which at least part of the representative contour is located outside the contour tolerance, e.g., by having a surface area less than the minimum desired surface area or greater than the maximum desired surface area, an edge which deviates from a desired edge profile by more than an acceptable predetermined limit, etc. Contour tolerances in methods according to the disclosure may additionally or alternatively pertain to edge profiles, separation distances between two contours, and/or other positional metrics for analysis.

FIG. 1 provides a schematic data flow diagram of components and processes for computer-aided circuit manufacture according to embodiments of the disclosure. FIG. 1 illustrates a layout 100 indicative of at least a portion, in plane X-Y, of a mask to be printed for fabrication of an integrated circuit (IC). The design of layout 100 may have been modified for manufacturability using optical proximity correction (OPC), optical rule checking (ORC), or other techniques. Layout 100 may include patterns 102, 104 to be printed at respective positions. Although two patterns 102, 104 are shown in layout 100 for the purposes of demonstration, it is understood that layout 100 of FIG. 1 may represent only a portion of a larger layout for a mask to be printed. More specifically, layout 100 depicted in FIG. 1 may represent a subset of a particular layout. Layout 100 may include multiple patterns 102, 104 which are in close physical proximity relative to other patterns, and/or may be functionally interrelated or designed to be manufactured together. In some cases, layout 100 may include only a select group of regions and associated patterns 102, 104 which may be structured to target underlying portions of a layer for preservation, removal, etc. Each pattern 102, 104 in layout 100 may include corresponding widths in plane X-Y, e.g., $W_1$ of pattern 102. Patterns 102, 104 may be spaced apart, e.g., by a respective separation distance $D_{S1}$ along a corresponding axis (shown along Y-axis for the sake of example).

A manufacturing tool 150 (e.g., a single manufacturing tool and/or a group of interconnected devices for producing a printed mask 160 from a proposed layout) may be operable to receive layout 100 and yield printed mask based on layout 100. Printed mask 160 may include one or more printed features 162, 164 formed based on, e.g., pattern(s) 102, 104 of layout 100. Manufacturing tool 150 may be operable to, e.g., cause manufacture of one or more printed features 162, 164 at positions designated with patterns 102, 104 in layout 100. As shown, printed features 162, 164 may vary in size, shape, etc., from their corresponding patterns 102, 104 in layout 100. Structural differences between patterns 102, 104 and printed features 162, 164 may be caused by processing variants, e.g., differences in light intensity, the position and operation of various components in manufacturing tool 150, proximity effects from other patterns in layout 100, etc. Printed features 162, 164 may also have, e.g., an X-Y width $W_2$ and separation distance $D_{S2}$ along Y-axis, which may be similar to or different from separation distance $D_{S1}$ and/or width $W_1$ in layout 100.

Systems according to the disclosure may include a library 170 of mask images 172 corresponding to various layouts 100 and/or printed masks 160, and which may include printed features 162, 164. In accordance with embodiments of the disclosure, library 170 is connected to, and modified by a mask analysis program 174 including, e.g., one or more systems for analyzing and interpreting mask images 172 as discussed herein. Mask analysis program 174 may be housed, e.g., in a computer system 202, and the various systems and modules therein may operate through one or more processing techniques described herein. Mask analysis program 174 may select particular regions of each mask image 172 for analysis, and remove non-selected regions to create modified images 176 for use in further analysis pursuant to additional and/or optional processes discussed elsewhere herein. Computer system 202 may be in communication with library 170, e.g., according to any currently-known or later developed solution for communicating between data repositories (e.g., library 170), computer systems (e.g., computer system 202), and/or other data repositories discussed herein.

A mask repository 178 may be communicatively coupled to library 170 and mask analysis program 174 of computer system 202, e.g., for containing multiple layouts 100, each configured to create printed mask(s) 160. Although mask repository 178 is shown by example to be a distinct device and/or component with respect to computer system 202, it is understood that mask repository 178 may be included as part of computer system 202 (e.g., within a memory unit) in various embodiments. Mask repository 178 may be communicatively connected to manufacturing tool 150, library 170, and computer system 202 to perform various functions. For instance, manufacturing tool 150 may receive layout(s) 100 from mask repository 178 to create printed masks 160 for each distinct IC product, layer, etc., based on information from layout(s) 100. Each layout 100 in mask 178 may include a field for identifying information, e.g., to permit computer system 202 to pair various mask images 172 in library 172 with their corresponding layout(s) 100 in mask repository 178.

Computer system 202 can aid in the design and manufacture of IC products by converting one or more mask images 172 into a set of representative contours, determining whether printed mask(s) 160 comply with manufacturing requirements based on whether the representative contours violate contour tolerances, and adjusting or flagging layout 100 based on the comparison. Mask analysis program 174 may perform such functions, e.g., by processing data from library 170 and/or layout repository 178 for one or more layouts 100. Mask analysis program 174 may generate instructions for adjusting manufacturing tool(s) 150, based on whether the representative contours for printed mask(s) 160 violate contour tolerances. Manufacturing tool(s) 150 may thereafter produce a printed mask based on layout 100, the generated instructions, and/or other processing requirements. The representative contours may be stored, e.g., in memory components of computer system 202. Further details regarding the conversion of mask images 172 into representative contours, and taking further action based on the representative contours for each mask image 172, are discussed in further detail below.

Figure 2:
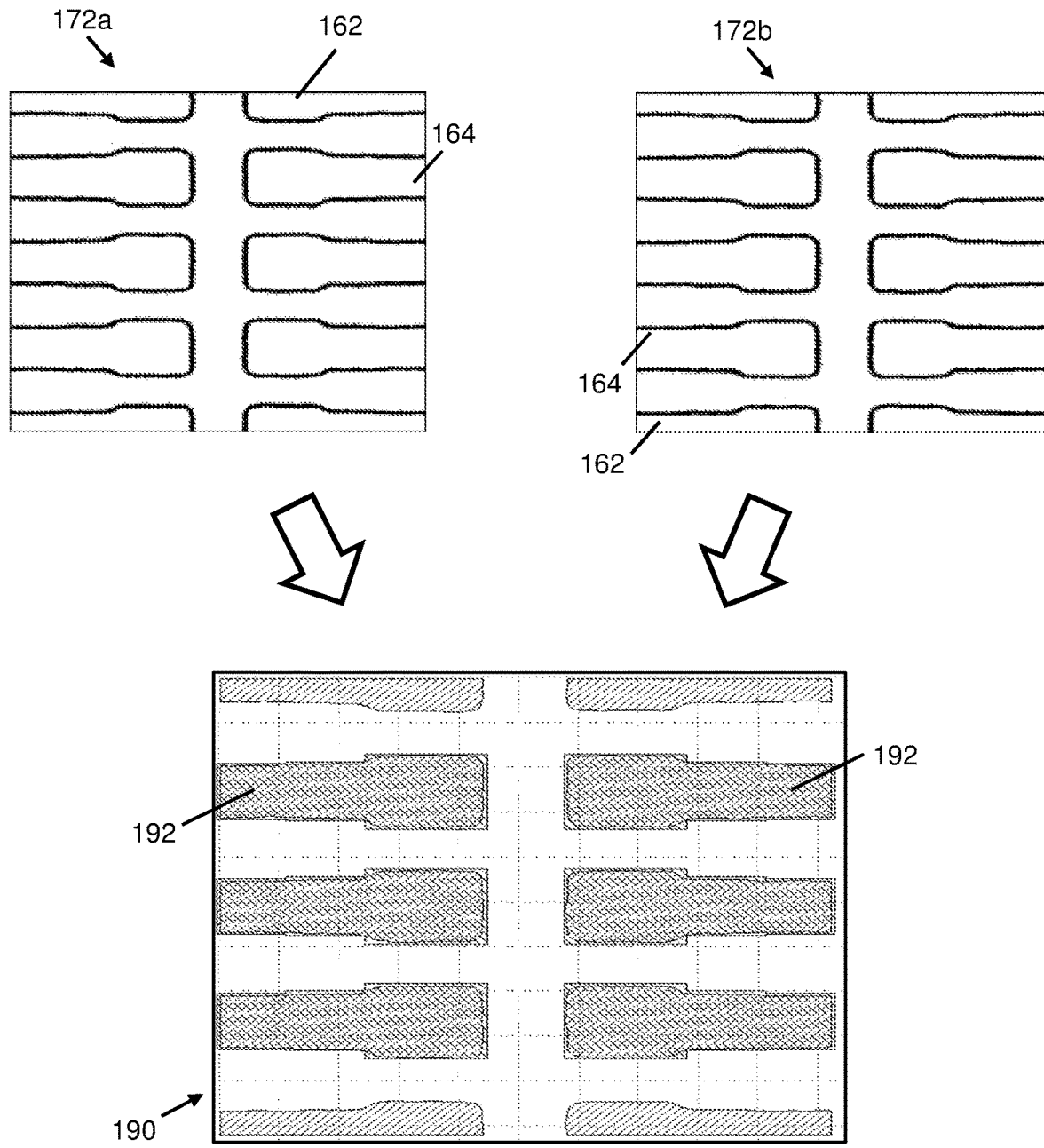
FIG. 2 depicts an example of converting two images of one printed mask into a plurality of representative contours according to embodiments of the disclosure.

Turning to FIG. 2, a procedure for converting multiple mask images 172, e.g., a downward-oriented image 172a and an upward oriented image 172b, into a plurality of representative contours 190 according to the disclosure is shown. Mask images 172 to be processed in embodiments of the disclosure may include one or more of a scanning electron microscope (SEM) image, an atomic force microscope (AFM) image, a mask aerial image, and/or other images captured by any currently known or later developed platform to capture images of printed mask(s) 160. As noted above, conventional analyzing of printed masks 160 may involve the direct processing and analysis of mask images 172, subject to computational requirements and/or limits on image resolution. To avoid this problem, embodiments of the disclosure provide a method for analysis of printed masks 160 by converting one or more original mask images 172 into representative contours 190 and analyzing representative contours 190 instead of mask images 172. An example of two mask images 172a, 172b is shown, with each mask image 172 including multiple printed features 162, 164 structured to define the shape of circuit features in a particular layer. As shown, printed features 162, 164 may be distinguishable from other portions of mask image 172 by having edge profiles of a particular thickness (measured directly, e.g., by pixels or indirectly by converting numbers of pixels into nanometers (nm) based on scaling and the format for mask image 172).

In the example of FIG. 2, two mask images 172 in the form of downward-oriented image 172a and upward-oriented image 172b may be used to create one plurality of representative contours 190. Each image 172a, 172b may illustrate the same group of printed features 162, 164, but from different points of view. Using both downward-oriented image 172a and upward-oriented image 172b together may account for the varying geometry of printed feature(s) 162, 164, and/or more easily allow mask analysis program 174 (FIG. 1) to map each image 172a, 172b to reference data and coordinates included in layout 100. In some cases, mask images 172 for multiple printed masks 160, and multiple views of each printed mask 160, may be processed together by mask analysis program 174 (FIG. 1). Thus, plurality of representative contours may include contours 192 for two or more printed masks 160, which may in turn be used to form multiple layers of a single device.

Embodiments of the disclosure may include using mask analysis program 174 (FIG. 1) to create a plurality of representative contours 190. Plurality of representative contours 190 may be composed of several individual contours 192, such that each contour 192 corresponds to one of the original printed features shown in mask image(s) 172a, 172b, e.g., one contour 192 may represent printed feature 162 while another contour 192 may represent printed feature 164. Printed features 162, 164 and contours 192 in FIG. 2 are included merely to provide an example illustration, and do not necessarily indicate the total number of individual contours which may be included in plurality of representative contours 190. As noted above, the disclosure may include causing mask analysis program 174 to generate representative contours 192 pursuant to any currently known or later developed technique for from two-dimensional contours from mask images 172a, 172b. Techniques for converting image(s) 172 into plurality of contours 190 may include, e.g., detecting sets of coarse edges within mask images 172a, 172b, filtering noise and/or other artifacts from the image to remove structures not pertaining to printed features 162, 164, mapping the detected edges of each printed feature 162, 164 onto a two dimensional plane, and constructing plurality of representative contours 190 from the result of such processes. Each contour 192 may be created to fit a particular two-dimensional map for contours 192, and within a particular margin of accuracy or resolution with response to a coordinate grid for plurality of representative contours 190. As noted above, each contour 192 in plurality of representative contours 190 may correspond to a single printed feature, with the original printed feature being visible in at least one mask image 172. Where multiple mask images 172a, 172b are used, image data and perspective data (e.g., whether the image is upward-oriented or downward-oriented) may be cross-referenced with each other to determine the shape and position of each contour 192. As shown in FIG. 2, such processes for generating representative contours 192 for printed feature(s) 162, 164 in mask images 172a, 172b can create a non-image representation of printed masks 160 without significantly eliminating details shown for printed feature(s) 162, 164 in mask images 172a, 172b.

Figure 3:
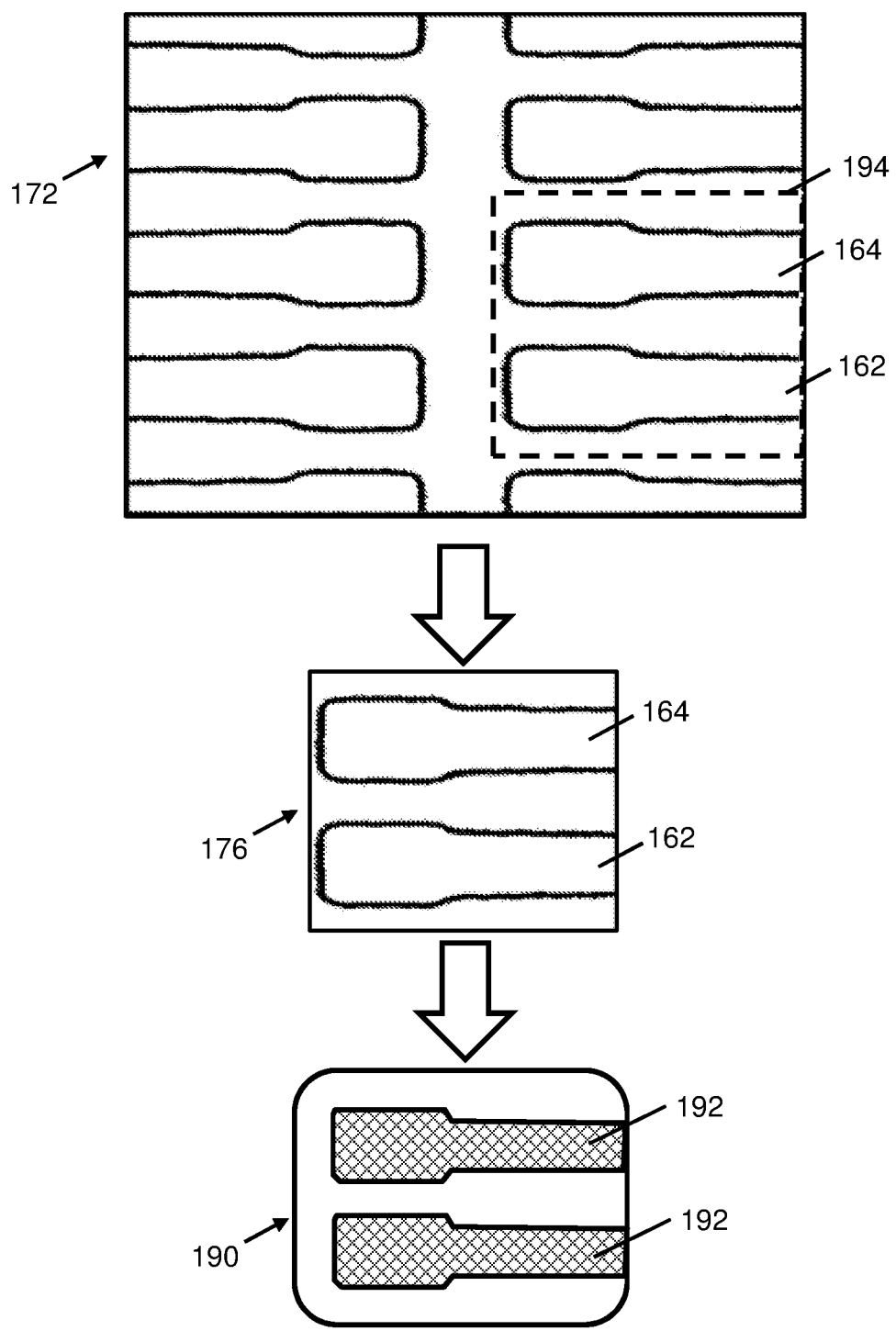
FIG. 3 depicts an example of selecting a region of a printed mask image for analysis, and converting the image of the selected region into a plurality of representative contours according to embodiments of the disclosure.

Referring now to FIG. 3, it may be desirable to analyze only selected portions of printed mask(s) 160, e.g., printed features 162, 164 with greater susceptibility to particular manufacturing risks (e.g., known from the characteristics of layout 100 and/or the printing of other masks). In such cases, mask analysis program 174 (FIG. 1) may include functionality for modifying mask images 172 before converting mask image(s) 172 into plurality of representative contours 190. In some cases, mask image(s) 172 may include one or more regions 194 (identified with phantom lines) which include printed features 162, 164 with a heightened risk of printing errors. Mask analysis program 174 (FIG. 1) thus may target (e.g., based on user instructions and/or automatically based on algorithms, metrics for determining printing risks, etc.) region(s) 194 in mask images 172 for conversion into contour(s) 192 for analysis. Mask analysis program 174 (FIG. 1) may remove portions of mask image(s) 172 outside the selected region(s) 194 to create modified image(s) 176 with only targeted printed features 162, 164 therein. Mask analysis program 174 (FIG. 1) may then convert modified image(s) 176 into plurality of representative contours 190 to analyze region(s) 194, by way of one or more techniques described above regarding the conversion of images into representative contours.

Figure 4:
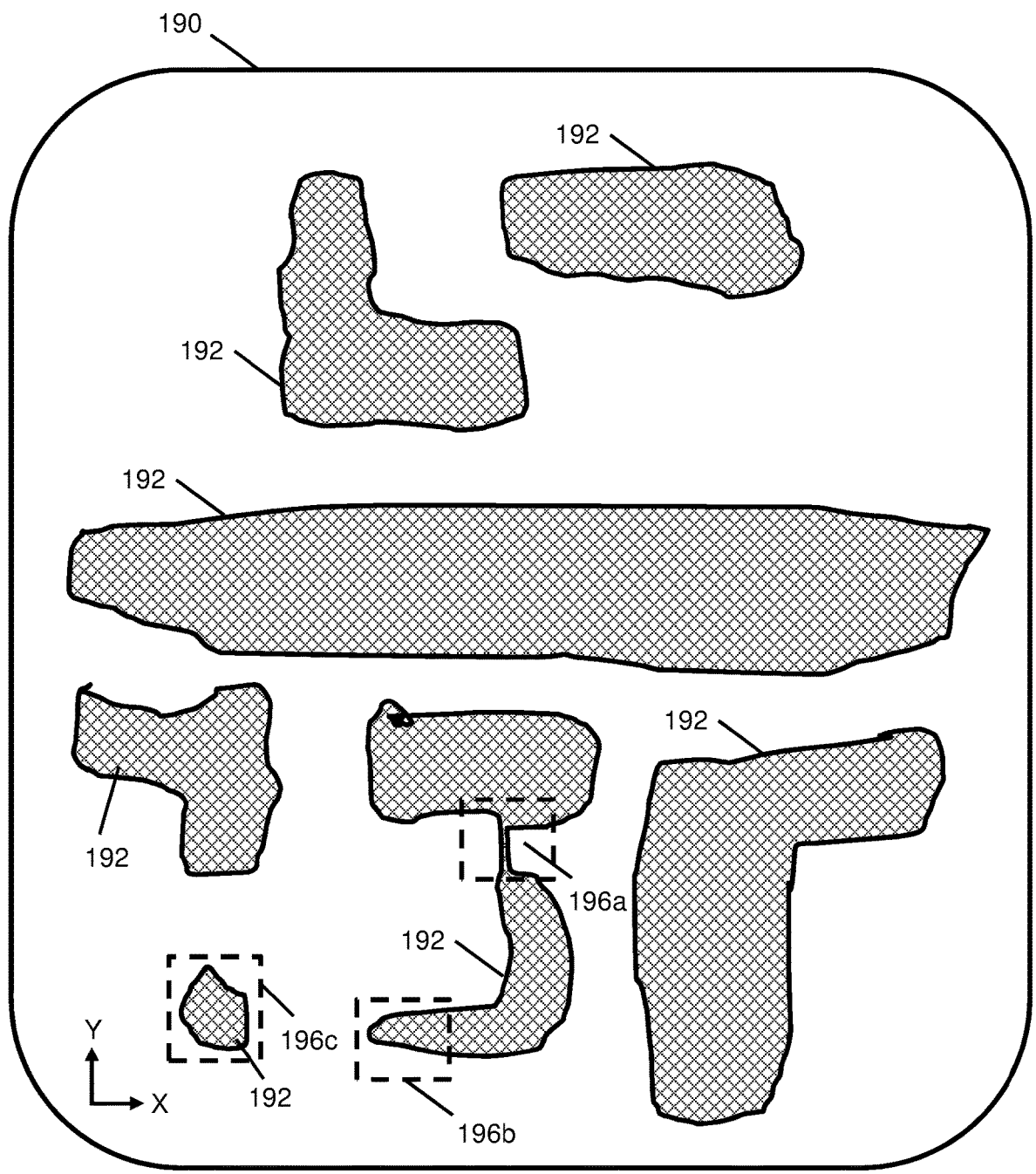
FIG. 4 depicts an example of a plurality of representative contours with printing defects according to embodiments of the disclosure.

Turning now to FIG. 4, the disclosure pertains to analytical techniques for determining, based on plurality of representative contours 190, whether printed mask(s) 160 (FIG. 1) include printing defects. Thus, various types of printing defects and their appearance in plurality of contours 190 are discussed. FIG. 4 illustrates a plurality of contours 190 in plane X-Y, with each contour 192 therein being generated from one or more circuit images 172 (FIGS. 1-3). Plurality of contours 190 may depict a group of printing defects 196a, 196b, 196c originating, e.g., from design problems in layout 100, proximity effects on printing caused by printed features 162, 164 (FIGS. 2, 3) being nearby each other in layout 100, mis-calibration or operational errors of manufacturing tool 150, etc. Printing defects 196a, 196b, 196c thus may originate from a large number of manufacturing risks, and may appear in plurality of contours 190 with a variety of physical characteristics.

FIG. 4, for example, shows one printing defect 196a which links two contours 192 together at a point not permitted by layout 100 (FIG. 1). Such inadvertent connections between two printed features 162, 164, indicated by contour(s) 192 will cause the corresponding printed features 162, 164 of printed mask 160 to form a single feature where two features should appear. Another printing defect 196b may take the form of a "pinched" region of contour 192, e.g., where the corresponding printed feature(s) 162, 164 exhibit a thinner width than permitted by layout 100. Printing defects 196 which cause pinching of contours 192 and their corresponding printed features 162, 164 may affect printed mask 160, e.g., by causing some materials to be removed, rather than protected by printed mask 160. A third printing defect 196c may take the form of an edge placement error (EPE), e.g., printed mask 160 creating printed feature(s) 162, 164 (as shown by contour 192) at a location where layout 100 does not include printed feature(s) 162, 164. Although printing defects 196a, 196b, 196c may be visible from a visual analysis of plurality of contours 190, embodiments of the disclosure provide analytical techniques for automatically detecting where printing defects 196a, 196b, 196c appear in plurality of contours 190 for depicting mask images 172. It is also understood that printing defects 196 other than pinching, bridging, and/or EPEs may appear in some printed masks 160, depending upon the particular layout 100, characteristics of printed mask 160, and/or other situational factors.

Figure 5:
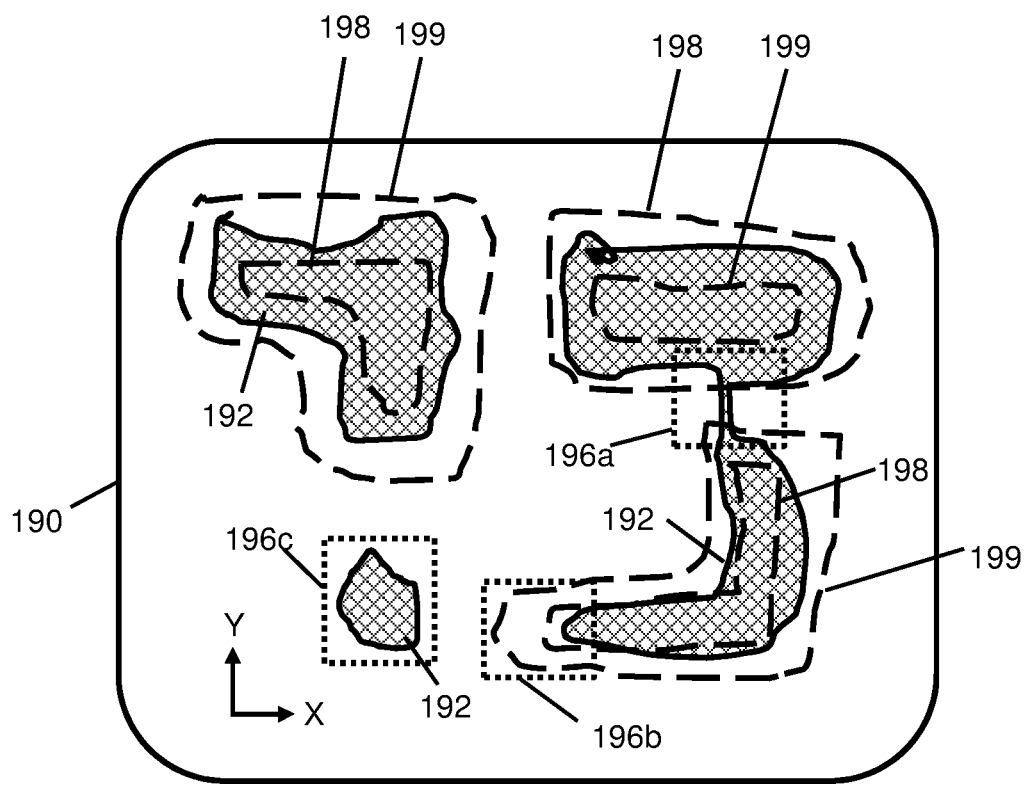
FIG. 5 depicts an example of comparing a plurality of representative contours with contour tolerances according to embodiments of the disclosure.

Turning to FIG. 5, contours 192 which exhibit printing defects 196a, 196b, 196c are shown to illustrate processes for analyzing where printing defects 196a, 196b, 196c appear in plurality of contours 190. As also discussed elsewhere herein, methods according to the disclosure can identify the location of printing defects 196a, 196b, 196c by comparing each contour 192 to a set of contour tolerances 198, 199 configured to indicate the acceptable range of sizes, shapes, locations, etc., of printed feature(s) 162, 164 (FIGS. 1-3) to be printed from layout 100. In the example of FIG. 5, contour tolerances 198, 199 are provided in pairs, with each pair corresponding to a particular contour 192 in plurality of contours 190. An inner contour tolerance 198 defines an inner boundary for contour 198, while an outer contour tolerance 199 may define an outer boundary for the same contour 192. Contours 192 thus may be deemed free of defects by having edge profiles located entirely between a corresponding pair of contour tolerances 198, 199. According to the example of FIG. 5, printing defect 196a indicative of bridging is detectable because two contours 192 each have an edge outside the outer boundary for their corresponding contour tolerances. Printing defect 196b indicative of pinching is detectable because the edge profile of one contour 192 is positioned within the inner boundary of its inner contour tolerance 198. Printing defect 196c indicative of edge placement errors (EPEs) is detectable by one contour 192 not having an associated set of contour tolerances 198, 199. It is also understood that in further embodiments, contour tolerances 198, 199 may include additional or alternative criteria (e.g., location ranges, edge thicknesses, etc.) selected for detecting other types of defects in printed masks 160 created from corresponding layouts 100. As discussed in further detail below, mask analysis program 174 (FIG. 1) may implement process methodologies for combining the various techniques, transformations, models, etc., shown in FIGS. 2-4 and discussed herein into a comprehensive methodology for analyzing printed masks 160 for defects. Methods according to the disclosure may analyze printed masks 160 for defects without direct analysis or interpretation of mask images 172.

Figure 6:
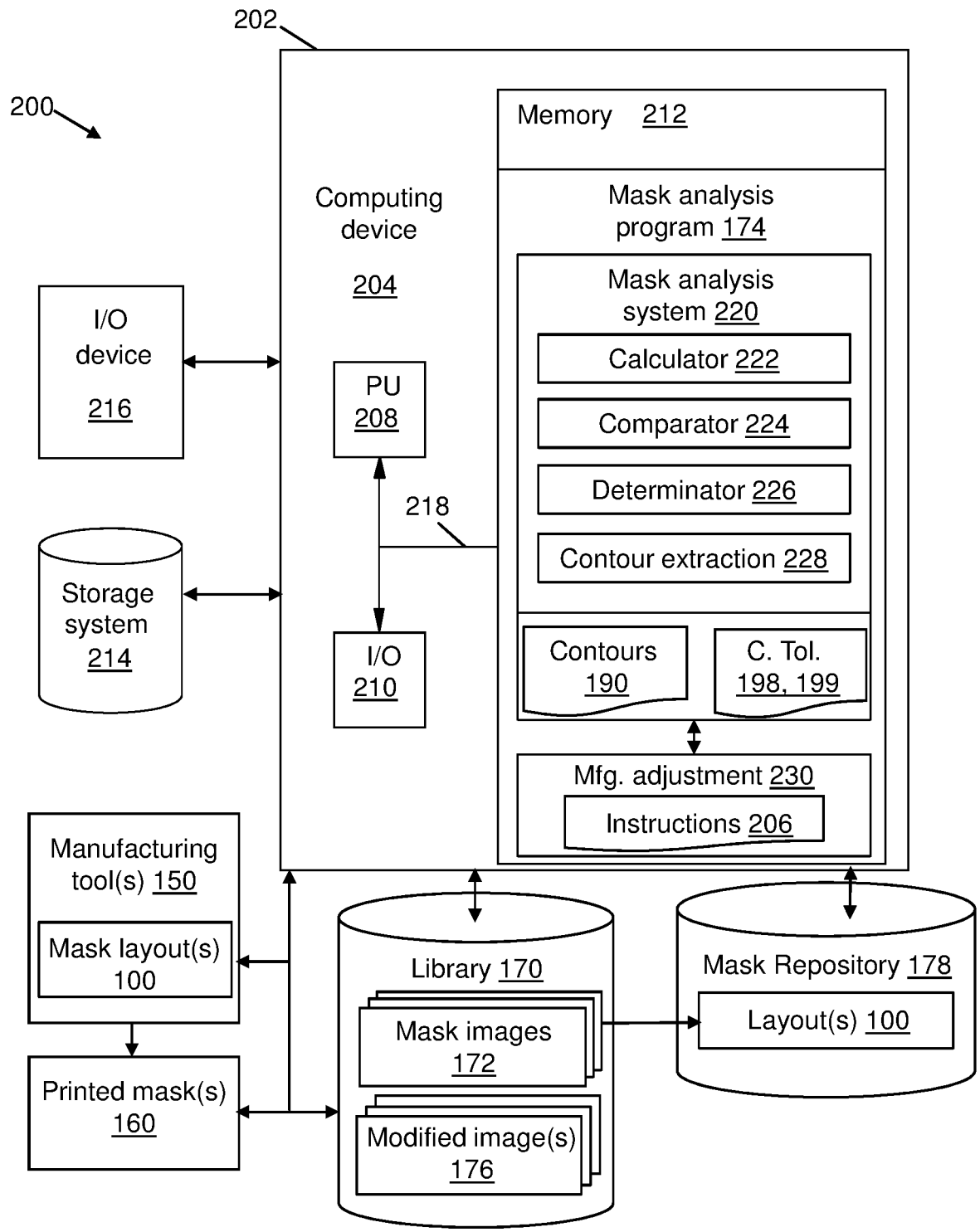
FIG. 6 depicts an illustrative environment, which includes a computer system configured to interact with a manufacturing tool, library, and specification for analyzing a printed mask according to embodiments of the disclosure.

Referring to FIG. 6, an illustrative environment 200 for implementing the methods and/or systems described herein is shown. In particular, a computer system 202 is shown as including computing device 204. Computing device 204 may include, e.g., a mask analysis program 174 which may include, e.g., one or more sub-systems (mask analysis system 220, manufacturing adjustment system (abbreviated as "mfg. adjustment" in FIG. 5) 230), for performing any/all of the processes described herein and implementing any/all of the embodiments described herein.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 may execute program code, such as mask analysis program 174, which is at least partially fixed in memory 212. While executing program code, processing unit 208 may process data, which may result in reading and/or writing data from/to memory 212 and/or storage system 214. Pathway 218 provides a communications link between each of the components in environment 200. I/O component 210 may comprise one or more human I/O devices, which enable a human user to interact with computer system 202 and/or one or more communications devices to enable a system user to communicate with the computer system 202 using any type of communications link. To this extent, mask analysis program 174 may manage a set of interfaces (e.g., graphical user interface(s), application program interface(s), etc.) that enable system users to interact with mask analysis program 174. Further, mask analysis program 174 may manage (e.g., store, retrieve, create, manipulate, organize, present, etc.) data, through several modules contained within a mask analysis system 220 and/or manufacturing adjustment system 230. Mask analysis system 220 and manufacturing adjustment system 230 are shown by example as being sub-systems of mask analysis program 174. However, it is understood that mask analysis system 220 and manufacturing adjustment system 230 may be wholly independent systems.

As noted herein, mask analysis program 174 may include mask analysis system 220 and manufacturing adjustment system 230. In this case, modules 222, 224, 226, 228, of mask analysis system 220 may enable computer system 202 to perform a set of tasks used by mask analysis program 174, and may be separately developed and/or implemented apart from other portions of mask analysis program 174. Calculator 222 can implement various mathematical computations in processes discussed herein. Comparator 224 can compare two quantities and/or items of data in processes discussed herein. Determinator 226 can make logical determinations based on compliance or non-compliance with various conditions in processes discussed herein. Contour extraction module (abbreviated as "contour extraction" in FIG. 6) 228 can include one or more formulas, steps, algorithms, etc., for automatically converting mask images 172 into plurality of contours 190 to be analyzed according to the disclosure. One or more modules 222, 224, 226, 228, may use algorithm-based calculations, look up tables, software code, and/or similar tools stored in memory 212 for processing, analyzing, and operating on data to perform their respective functions. Each module discussed herein may obtain and/or operate on data from exterior components, units, systems, etc., or from memory 212 of computing device 204. Mask analysis program 174 can also include data in the form of contours 192 and contour tolerances 198, 199 corresponding to each layout 100.

Mask analysis system 220 may manipulate, interpret, and analyze various forms of information in library 170, including mask images 172 and/or mask repository 178, to produce representative contours from corresponding images 172 of printed masks 160 as described herein. In addition, mask analysis system 220 may generate contours 192 for comparison with contour tolerances 198, 199 based on mask images 172, modified images 176, etc. In further embodiments, manufacturing adjustment system 230 may produce various outputs (e.g., instructions 206) based on contours 192 as compared with contour tolerances 198, 199 for particular layouts 100. Library 170 and/or mask repository 178 can be communicatively coupled to computing device 205 through any individual or combination of physical and/or wireless data coupling components discussed herein. Some attributes of layout 100 may be converted into a data representation (e.g., a data matrix with several values corresponding to particular attributes) and stored electronically, e.g., within memory 212 of computing device 204, storage system 214, and/or any other type of data cache in communication with computing device 204.

Images and/or other representations of layout 100, printed mask(s) 160, etc., may additionally or alternatively be converted into data inputs or other inputs to mask analysis program 174 with various scanning or extracting devices, connections to independent systems (e.g., mask repository 178), and/or manual entry of a user. As an example, e.g., a user of computing device 204 may submit mask images 172, layout(s) 100, and/or other forms of information to mask analysis program 174. Following embodiments of the processes discussed herein mask analysis program 174 of computing device 204 can output instructions 206 based on contours 190, contour tolerances 198, 199, etc., for printed masks 160 and in some cases may automatically adjust manufacturing tool(s) 150 based on instructions 206.

Computer system 202 may be operatively connected to or otherwise in communication with manufacturing tool 150 having one or more manufacturing adjustment tools configured to construct and modify layouts 100, as part of the mask analysis system 220 for analyzing printed masks 160 based on contours 190, as discussed herein. Computer system 202 may thus be embodied as a unitary device in a semiconductor manufacturing plant coupled to manufacturing tool 150 and/or other devices, or may be multiple devices each operatively connected together to form computer system 202. Embodiments of the present disclosure may thereby include using mask analysis program 174 to identify where contours 192 violate contour tolerances 198, 199. As discussed herein, embodiments of the present disclosure provide instructions 206 for adjusting manufacturing tool(s) 150 based on contours 190, e.g., depending on where and whether contours 192 violate contour tolerances 198, 199.

Where computer system 202 comprises multiple computing devices, each computing device may have only a portion of mask analysis program 174, mask analysis system 220 (including, e.g., modules 222, 224, 226, 228), and/or manufacturing adjustment system 230 fixed thereon. However, it is understood that computer system 202 and mask analysis system 220 are only representative of various possible equivalent computer systems that may perform a process described herein. Computer system 202 may obtain or provide data, such as data stored in memory 212 or storage system 214, using any solution. For example, computer system 202 may generate and/or be used to generate data from one or more data stores, receive data from another system, send data to another system, etc.

Figure 7:
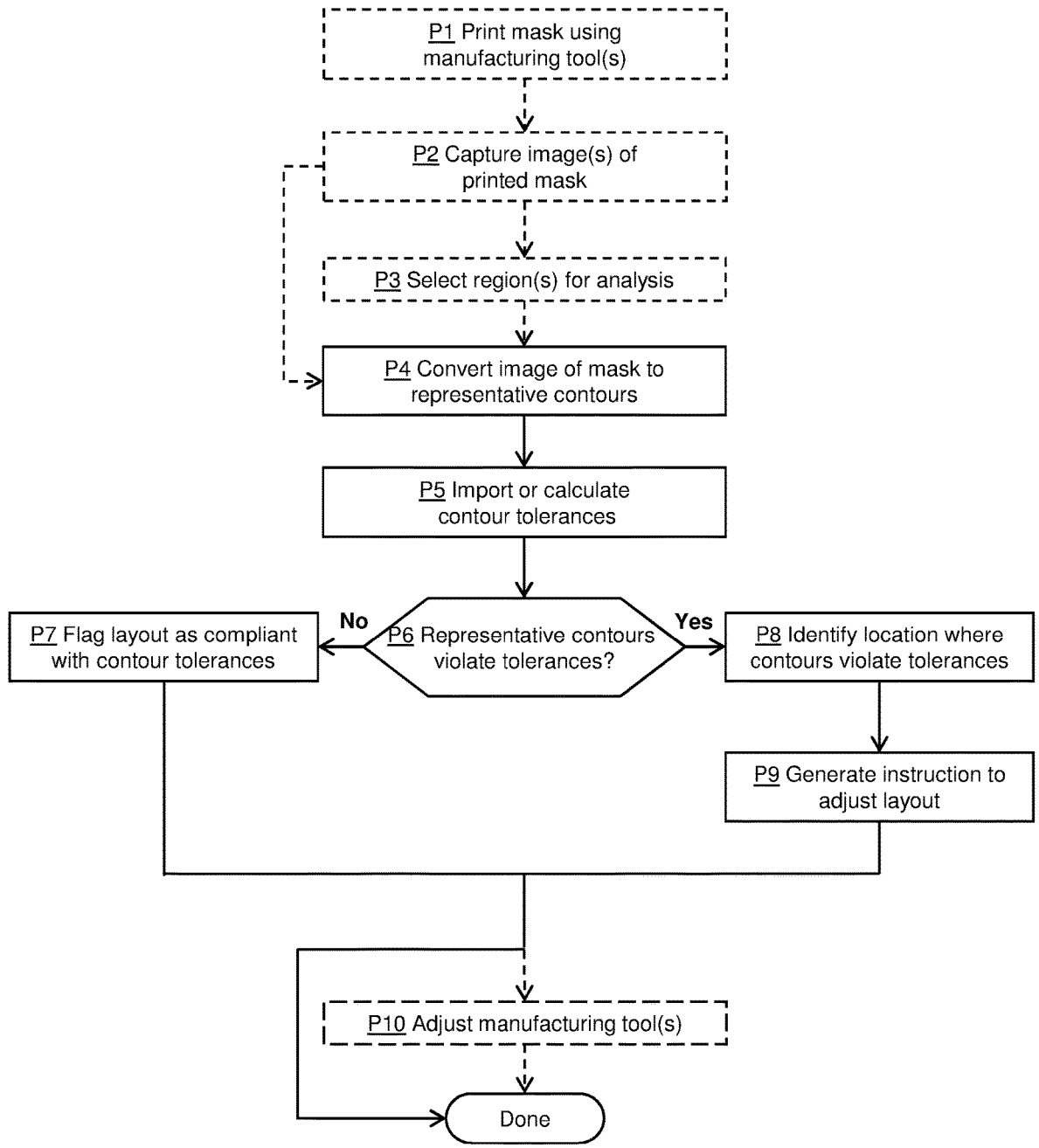
FIG. 7 is an example flow diagram of a method for analyzing printed masks according to embodiments of the disclosure.

Referring to FIGS. 1, 6, and 7 together, illustrative processes are shown for analyzing printed masks 160 to identify the presence and/or location of various printing defects 196 (FIG. 5), and generating instructions 206, to adjust layout(s) 100 to compensate for printing defects. The steps and processes depicted in FIG. 7 may be implemented, e.g., with components of mask analysis program 174, one or more modules 222, 224, 226, 228 of mask analysis system 220, and/or other components of computer system 202 described herein by example. A single and/or repeated execution of the processes discussed herein may allow for repeated updating of manufacturing tool(s) 150 to account for defects in printed masks 160 which cannot be determined from analysis of mask images 172, or other analyses of layout 100. In the example processes discussed herein, layout 100 will generally be described as including at least two patterns 102, 104 therein, with some alternative examples referring to mask layouts with different numbers of patterns (e.g., one pattern, four patterns, ten patterns, etc.). It is also understood that the present disclosure may be implemented with respect to multiple layouts 100 simultaneously and/or sequentially, with each layout 100 including patterns 102, 104 with any conceivable dimensions, in any conceivable number, etc., and that other examples are discussed herein where appropriate. The various processes discussed herein, furthermore, may be implemented before, after, or during other processes to create layout 100 for use in the manufacture of IC products. The methodology discussed herein may be implemented through alternative embodiments of computer system 202. For example, one library 170 may be used for multiple layouts 100 in embodiments of the disclosure. Multiple libraries 170 and/or IC analysis programs 174 may alternatively be applied to one layout 100. Further alternative examples may include different combinations or numbers of layouts 100, libraries 170, IC analysis programs 174, etc.

In a preliminary action, methods according to the disclosure can include printing mask(s) 160 using manufacturing tool(s) 150, and from a corresponding layout 100 as described herein. Process P1 in some cases may be implemented independently, e.g., by a separate manufacturing entity, before being provided to a circuit analysis entity to implement the analysis techniques described herein. Process P1 is therefore shown in phantom to illustrate this optional process according to embodiments. Each printed mask can include several structures, e.g., printed features 162, 164, therein. Layout(s) 100 may be submitted to manufacturing tool 150 through computer system 202, e.g., as inputs to I/O device 216 through a computer-readable storage medium and/or other computer-readable inputs to computer system 202. Computer system 202, in turn, can instruct manufacturing tool 150 to manufacture printed mask(s) 160 according to the information included in specification(s) 100. Layout 100 may be modified before the manufacturing in process P1, e.g., by various conventional processing techniques including OPC, ORC, etc., to reduce the number of projected defects before manufacture. In contrast to these techniques, embodiments of the disclosure can analyze manufactured mask(s) 160 and generate instructions 206 based on contours representative of printed mask(s) 160, as discussed herein.

To analyze the features of printed mask(s) 160, additional preliminary actions may include capturing one or more images of printed mask(s) 160 in process P2. The captured mask image(s) 172 may be stored in library 170, e.g., as one or more mask images 172 to be analyzed according to the disclosure. As noted elsewhere herein, it is possible to convert multiple mask images 172 of one printed mask 160 (e.g., downward-oriented mask image 172a and upward-oriented mask image 172b as shown in FIG. 2) into one plurality of representative contours 190 for one printed mask 160. Any currently known or later developed image microscopy technique may be implemented to capture an image of printed mask in process P2. In one example, capturing the image of printed mask can include using a scanning electron microscope (SEM), transmitting electron microscope (TEM), and/or other devices as well as sub-classifications of such devices. Further examples may include applying one or more physical probes (e.g., atomic force microscopy (AFM) probes) for capturing images of printed mask 160. It is also understood that the various image capture tools discussed herein may be used together and/or with other currently known or later developed technologies to generate mask images 172 as a composite of multiple images.

As discussed elsewhere herein, it may be desirable to remove some regions from image(s) 172 before analysis, e.g., in cases where some portions of mask image(s) 172 include photoresist features 180 (FIG. 3) which do not have a significant risk of printing defects. The disclosure may include, at process P3, selecting (e.g., via I/O device 216 to mask analysis program 174) one or more region(s) 194 (FIG. 3) in mask image(s) 172 for analysis. The selecting of regions 194 may be driven wholly or in part by the selection of a user, and/or the use of algorithms, look-up tables, and/or other techniques for identifying which regions 194 in mask image 172 are more likely to include printing defects. Process P3 may therefore include removing portions of mask image(s) 182 from analysis outside the selected regions 194 to create modified image(s) 176, as shown in FIG. 3 and as described elsewhere herein. Where a user wishes to analyze an entire mask image 172, the disclosure may include proceeding to subsequent processes without removing portions of mask image(s) 172 from analysis.

Methods according to the disclosure can analyze printed mask by converting mask images 172 and/or modified images 174 into pluralities of representative contours 192 (FIG. 2-4), as discussed herein. At process P4, contour extraction module 228 of mask analysis system 220 can accept image(s) 172, 176 as an input, and apply one or more image recognition techniques, processes, algorithms, etc., to convert image(s) 172, 176 into a plurality of representative contours 192. As discussed elsewhere herein, such processes may include filtering noise and/or other artifacts from mask image(s) 172, detecting the edges of printed feature(s) 162, 164 (FIGS. 2, 3), and then mapping representative contours 192 onto locations in a two-dimensional space (e.g., plane X-Y). Representative contours 192 thus provide a simplified graphical depiction of printed masks 160 similar to layout 100. Further processes of the disclosure may automatically identify the properties of representative contours 192, after the converting in process P3, to automatically analyze the characteristics of printed mask(s) 160.

Embodiments of the disclosure may include various techniques for converting mask image(s) 172 to representative contours 192. It is thus understood that the various examples for converting mask image(s) 172 into representative contours at process P4 may be implemented by way of alternative mechanisms, in different orders, with other steps added and/or omitted, etc. In one example contour extraction module 228 of mask analysis system 220 can detect coarse edges within mask image(s) 172, e.g., by identifying different textures, shades, etc., in mask image 172 above a threshold thickness. Such coarse edges may be selected by contour extraction module 228 and compared to one or more reference values by comparator 224 to identify the location of printed features 162, 164 (FIGS. 2, 3). According to one example, contour extraction module 228 can include an algorithm for detecting feature edges in each mask image 172 above a threshold thickness (e.g., above five nanometers, ten nanometers, and/or other predetermined threshold values), while ignoring edges and/or image data with a thickness lower than the predetermined threshold. Contour extraction module 228 can then automatically generate a map in two-dimensional space of each detected edge and thereby create individual contours 192. Contour extraction module 228 may also exclude image artifacts and/or irrelevant information from further processing.

After detecting coarse edges in mask image(s) 172, converting mask image(s) 172 to plurality of representative contours 190 may include calculating the separation distances between each coarse edge, i.e., the "edge separation distances" in mask image 172. Calculator 222 of mask analysis system 220 may calculate edge separation distances by any currently known or later developed measurement technique for converting the distance between two points, shapes, regions, etc., in an image to corresponding values in physical space. In some cases, contour extraction module 228 in process P4 can simply import the existing measurement and/or edge separation values from a SEM system for generating mask image(s) 172 without separately calculating the edge separation distances in mask image(s) 172. However implemented, calculating edge separation distances for the set of coarse edges in process P4 can yield a complementary measurement of where printed features 162, 164 are absent in mask image(s) 172, and how much space should appear between neighboring contours 192 according to layout 100 and/or other forms of reference information stored in mask repository 178 or elsewhere.

Additional techniques for converting mask image(s) 172 into plurality of representative contours 190 may include using calculator 222 and/or comparator 224 to compare the detected coarse edges and calculated edge separation distances with the projected characteristics of printed mask 160, which may be prescribed by layout 100. Mask analysis program 174 thus may compare multiple mask images 172 (e.g., mask images 172a, 172b (FIG. 2) for printed mask(s) 160 with corresponding information in layout 100 and/or elsewhere in mask repository 178, computing a mathematical average of the location for each coarse edge, edge separation distance, etc., for each mask image 172. To this extent, it is understood that representative contours 192 may correspond to a single printed mask 160 produced from layout 100, several printed masks 160 produced from one layout 100, and/or other combinations of printed masks 160 or specifications 100. In some cases, the contour extraction techniques described herein may be combined with other currently known or later developed techniques for filtering noise, irrelevant data, and/or image artifacts from mask images 172, e.g., mathematical transforms, data filtering, etc. The various techniques discussed herein thus automatically extract the relevant feature data from mask image(s) 172 to increase the accuracy of analysis of contours 192 used in subsequent processes.

Regardless of how plurality of representative contours 190 is created in process P4, the processing methodology may continue to process P5 of alternatively importing or calculating contour tolerances 198, 199 for each contour 192 in plurality of representative contours 190. At process P5, mask analysis system 220 may obtain contour tolerances 198, 199 from an external source (e.g., via I/O device 216) for storage in memory 212. In other implementations, calculator 222 of mask analysis system 220 may calculate contour tolerances 198, 199 based on layout 100, e.g., based on the maximum and minimum printing size for printed feature(s) 162, 164 (FIGS. 2, 3) included in layout 100. In any case, mask analysis system 220 may superimpose contour tolerances 198, 199 onto plurality of representative contours 190 to analyze whether one or more contours 190 include printing defects 196 (FIG. 5).

Continuing to process P6, methods according to the disclosure may include determining whether one or more contours 192 violate contour tolerances 198, 199 and thus include printing defect(s) 196 (FIG. 5). Specifically, determinator 226 of mask analysis system 220 may determine which contours 192 include edges which violate contour tolerance(s) 198, 199, and the location in plurality of representative contours 190 where such violations occur. In situations where no contours 192 violate contour tolerance(s) 198, 199 (i.e., "No" at process P6) the method may continue to process P7 of flagging layout 100 as being compliant with contour tolerance(s) 198, 199, i.e. layout 100 creates printed masks 160 without printing defects 196.

In cases where plurality of representative contours 190 includes one or more printing defects 196 (i.e., "Yes" at process P6), the method may continue to process P8 of identifying (e.g., by way of calculator 222, determinator 226, and/or embedded coordinates for plurality of contours 190) one or more locations where particular contour(s) 192 violate contour tolerance(s) 198, 199. The location of each printing defect 196 shown in plurality of contours 190 may denote a location where layout 100 should be adjusted. After determining where layout 100 needs to be adjusted to account for printing defect(s) 196, process P9 according to the disclosure can include generating instructions 206 to adjust manufacturing tool(s) 150 for creating manufactured circuit(s) 160. Instructions 206 can include one or more actions expressed, e.g., in vector format, for modifying the operation of manufacturing tool(s) 150. Instructions 206 can be based at least in part on the location(s) where printing defects 196 appeared in plurality of representative contours 190, and may also be based in part on the type of printing defect(s) 198, 199 detected in plurality of representative contours 190. The settings of manufacturing tool(s) 150 to be adjusted in process P8 can include the exposure dose, depth of focus, etch time, deposition time, and/or other properties of layout 100. For instance, in the case of a bridging defect (e.g., printing defect 196a (FIG. 5)), instructions 206 may include a reduction to the total deposition time and/or change to the printing area in order to remove bridging between adjacent features. In the case of a pinching defect (e.g., printing defect 196b (FIG. 5)), instructions 206 may cause manufacturing tool(s) 150 to create other printed masks 160 with increased deposition time, increase to printing area, etc., to increase the size of some features. In the case of an edge placement error (EPE) (e.g., printing defect 196c (FIG. 5)), instructions 206 may similarly effect the deposition and/or etching of particular features such that the location of etching, deposition, etc., complies with layout 100. Instructions 206 may be different for each type of error, and may include various changes suitable for removing the underlying source of a given printing defect 196.

After generating instructions in process P9 or flagging the layout in process P7, the method flow can terminate (i.e., "Done") after instructions 206 are provided to another system, component, etc., for independent adjusting of manufacturing tool(s) 150. In alternative embodiments, mask analysis program 174 can adjust manufacturing tool(s) 150 in process P10 by transmitting instructions 206 directly to manufacturing tool(s) 150. The method flow may then terminate upon adjusting manufacturing tool(s) 150 in process P10, or return to other processes (e.g., process P1-P5, etc., discussed elsewhere herein) and to repeat the operational methodology for another printed mask 160 created from layout 100 or a different layout 100.

As will be appreciated by one skilled in the art, aspects of the present disclosure may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As used herein, the term "configured," "configured to" and/or "configured for" may refer to specific-purpose patterns of the component so described. For example, a system or device configured to perform a function may include a computer system or computing device programmed or otherwise modified to perform that specific function. In other cases, program code stored on a computer-readable medium (e.g., storage medium), may be configured to cause at least one computing device to perform functions when that program code is executed on that computing device. In these cases, the arrangement of the program code triggers specific functions in the computing device upon execution. In other examples, a device configured to interact with and/or act upon other components may be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component may aid in performing a function, for example, displacement of one or more of the device or other component, engagement of one or more of the device or other component, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   converting at least one image of a printed mask to a plurality of representative contours, the plurality of representative contours corresponding to mask patterns in the printed mask;
   determining whether the printed mask includes a printing defect based on whether the plurality of representative contours violates a set of contour tolerances, the set of contour tolerances defining printing limits for the printed mask;
   in response to at least one of plurality of representative contours violating at least one of the set of contour tolerances:
      identifying a location in the at least one of the plurality of representative contours which violates the at least one of the set of contour tolerances, and
      generating an instruction to adjust a layout for the printed mask, based on the violating of the at least one of the set of contour tolerances; and
   in response to none of the plurality of representative contours violating the set of contour tolerances, flagging a layout for the printed mask as complying with the set of contour tolerances.

2. The method of claim 1, further comprising adjusting a manufacturing tool for creating the printed mask based on the generated instruction.

3. The method of claim 1, further comprising calculating the set of contour tolerances based on one of a possible pinching defect, a possible bridging defect, and a possible edge placement error (EPE) in the layout for the printed mask.

4. The method of claim 3, wherein the calculating of the set of contour tolerances includes defining inner and outer boundaries for each of the plurality of representative contours, and wherein a representative contour violates the set of contour tolerances by not being positioned between the inner and outer boundaries of a corresponding one of the set of contour tolerances.

5. The method of claim 1, wherein the at least one image of the printed mask includes a downward-oriented image of the printed mask, and an upward-oriented image of the printed mask.

6. The method of claim 1, wherein the at least one image of the printed mask is generated from one of a scanning electron microscope (SEM), an atomic force microscope (AFM), or a mask aerial image.

7. The method of claim 1, further comprising modifying the at least one image of the printed mask for analysis by performing actions including:
   selecting at least one region of the printed mask for analysis; and
   removing portions outside the selected at least one region from the at least one image of the printed mask.

8. A computer program product stored on a computer readable storage medium, the computer program product comprising program code, which, when being executed by at least one computing device, causes the at least one computing device to:
   convert at least one image of a printed mask to a plurality of representative contours, the plurality of representative contours corresponding to mask patterns in the printed mask;
   determine whether the printed mask includes a printing defect based on whether the plurality of representative contours violates a set of contour tolerances, the set of contour tolerances defining printing limits for the printed mask;
   in response to at least one of plurality of representative contours violating at least one of the set of contour tolerances, causing the at least one computing device to:
      identify a location in the at least one of the plurality of representative contours which violates the at least one of the set of contour tolerances, and
      generate an instruction to adjust a layout for the printed mask, based on the violating of the at least one of the set of contour tolerances; and in response to none of the plurality of representative contours violating the set of contour tolerances, causing the at least one computing device to flag a layout for the printed mask as complying with the set of contour tolerances.

9. The computer program product of claim 8, further comprising program code for causing the at least one computing device to adjust a manufacturing tool for creating the printed mask based on the generated instruction.

10. The computer program product of claim 8, further comprising program code for causing the at least one computing device to calculate the set of contour tolerances based on one of a possible pinching defect, a possible bridging defect, and a possible edge placement error (EPE) in the layout for the printed mask.

11. The computer program product of claim 10, wherein calculating of the set of contour tolerances includes defining inner and outer boundaries for each of the plurality of representative contours, and wherein a representative contour violates the set of contour tolerances by not being positioned between the inner and outer boundaries of a corresponding one of the set of contour tolerances.

12. The computer program product of claim 8, wherein the at least one image of the printed mask includes a downward-oriented image of the printed mask, and an upward-oriented image of the printed mask.

13. The computer program product of claim 8, wherein the at least one image of the printed mask is generated from one of a scanning electron microscope (SEM), an atomic force microscope (AFM), or a mask aerial image.

14. The computer program product of claim 8, further comprising program code for causing the at least one computing device to modify the at least one image of the printed mask for analysis by causing the at least one computing device to:
   select at least one region of the printed mask for analysis; and
   remove portions outside the selected at least one region from the at least one image of the printed mask.

15. A system comprising at least one computing device configured to perform a method by performing actions including:
   converting at least one image of a printed mask to a plurality of representative contours, the plurality of representative contours corresponding to mask patterns in the printed mask;
   determining whether the printed mask includes a printing defect based on whether the plurality of representative contours violates a set of contour tolerances, the set of contour tolerances defining printing limits for the printed mask;
   in response to at least one of plurality of representative contours violating at least one of the set of contour tolerances:
      identifying a location in the at least one of the plurality of representative contours which violates the at least one of the set of contour tolerances, and
      generating an instruction to adjust a layout for the printed mask, based on the violating of the at least one of the set of contour tolerances; and
   in response to none of the plurality of representative contours violating the set of contour tolerances, flagging a layout for the printed mask as complying with the set of contour tolerances.

16. The system of claim 15, wherein the method further includes adjusting a manufacturing tool for creating the printed mask based on the generated instruction.

17. The system of claim 15, wherein the method further includes calculating the set of contour tolerances based on one of a possible pinching defect, a possible bridging defect, and a possible edge placement error (EPE) in the layout for the printed mask.

18. The system of claim 17, wherein the calculating of the set of contour tolerances includes defining inner and outer boundaries for each of the plurality of representative contours, and wherein a representative contour violates the set of contour tolerances by not being positioned between the inner and outer boundaries of a corresponding one of the set of contour tolerances.

19. The system of claim 15, wherein the at least one image of the printed mask includes a downward-oriented image of the printed mask, and an upward-oriented image of the printed mask.

20. The system of claim 15, wherein the method further includes modifying the at least one image of the printed mask for analysis by performing actions including:
   selecting at least one region of the printed mask for analysis; and
   removing portions outside the selected at least one region from the at least one image of the printed mask.

* * * * *